United States Patent [19]

MacDowell et al.

[11] Patent Number: 4,833,104

[45] Date of Patent: May 23, 1989

[54] GLASS-CERAMIC SUBSTRATES FOR ELECTRONIC PACKAGING

[75] Inventors: John F. MacDowell, Painted Post; Robert J. Paisley, Corning, both of N.Y.

[73] Assignee: Corning Glass Works, Corning, N.Y.

[21] Appl. No.: 125,928

[22] Filed: Nov. 27, 1987

[51] Int. Cl.$^4$ .............................................. C03C 10/02
[52] U.S. Cl. ........................................ 501/10; 501/63; 501/65; 501/66
[58] Field of Search ........................ 501/10, 63, 65, 66

[56] References Cited

U.S. PATENT DOCUMENTS

| | | | |
|---|---|---|---|
| 3,519,445 | 7/1970 | MacDowell et al. | 501/10 OR |
| 3,922,155 | 11/1975 | Broemer et al. | 501/10 X |
| 4,576,920 | 3/1986 | MacDowell | 501/10 OR |

Primary Examiner—William R. Dixon, Jr.
Assistant Examiner—Karl Group
Attorney, Agent, or Firm—Clinton S. Janes, Jr.

[57] ABSTRACT

This invention is directed to the preparation of glass-ceramic materials especially suitable for use in multilayer substrates for integrated circuit packages. The inventive glass-ceramics are derived from thermally crystallizable glass which, in the form of frit, are capable of being sintered into an integral body at temperatures below 1000° C. and essentially concurrently crystallized in situ to yield $BPO_4$ as the predominant crystal phase. The inventive glass-ceramics exhibit a linear coefficient of thermal expansion between about $30-45 \times 10^{-7}/°C.$, a dielectric constant less than 5, and consist essentially, in weight percent, of 10–25% $B_2O_3$, 20–40% $P_2O_5$, and >50–65% $SiO_2$.

6 Claims, No Drawings

GLASS-CERAMIC SUBSTRATES FOR ELECTRONIC PACKAGING

BACKGROUND OF THE INVENTION

The forming process which is now widely used for fabricating multilayer glass-ceramic substrates suitable for integrated circuit packages comprises tape casting. That process contemplates nine general steps:

(1) a glass forming batch of a desired composition is melted;

(2) that melt is cooled to a glass;

(3) that glass is comminuted to a very fine particle size (called frit);

(4) that frit is blended into an aqueous and/or organic binder/vehicle to form a slip or slurry;

(5) that slurry is deposited (usually through doctor blading) as a layer onto a thin carrier film (normally of an organic);

(6) that layer is dried;

(7) that dried layer (called tap) is removed from the carrier film;

(8) several of those layers are stacked to form a laminate; and (9) that stack is fired to sinter the frit particles together into an integral body and subsequently cause the glass to crystallize in situ to a glass-ceramic.

In modern multilayered co-fired substrate systems, holes are punched or otherwise formed in the dried tape (termed vias) to allow connections to be made between layers, the tape is metallized with conductor and resistor patterns, and the laminate subsequently fired. The resulting multilayer package constitutes an electronic system capable of supporting several complex silicon chips on the bottom and top surfaces thereof.

Whereas $Al_2O_3$ has comprised the material most generally utilized in the production of ceramic substrates for integrated circuit packages, $Al_2O_3$ is subject to certain disadvantages, as will be explained below.

As the integrated circuit device becomes more complex, i.e., greater numbers of active electronic elements being packaged onto a silicon chip, a higher proportion of the system signal response time is needed to transmit signals between chips or to and from an operating application. Increased interconnect signal speed and integrity can be accomplished by shortening the signal path between chips, by using a ceramic material having improved electrical properties, i.e., having a lower dielectric constant and lower dissipation factor, and by reducing the resistance of the signal conductor and decreasing noise. Spacing the chips more closely demands very fine and closely-spaced signal lines and multilayer packages with fine vias. The combination of surface smoothness and flatness with close dimensional control becomes extremely critical for satisfactory fine line metallization and via registration. Although substrates and multilayer packages prepared from $Al_2O_3$ can be ground and polished to a smooth flat surface, the combination of difficulty in machining and the high thermal shrinkage of $Al_2O_3$ ($\approx 18\%$) has presented problems in securing high density via and pad registration. Furthermore, the relatively high dielectric constant of $Al_2O_3$ at ambient temperature ($\approx 9-10$) limits the capability to space the signal lines very close together, while avoiding cross talk and noise, and also retards the speed of the signal itself. Moreover, the linear coefficient of thermal expansion of $Al_2O_3$ is much higher than that of silicon, thus hazarding problems in securing a firm bond therebetween.

Finally, another major drawback in the use of $Al_2O_3$ in integrated circuit packages resides in the need for employing highly refractory metals such as molybdenum and tungsten for metallization because of the high firing temperatures required for sintering $Al_2O_3$ ($\geqq 1500°$ C.). Hence, whereas the electrical resistivities of molybdenum and tungsten are relatively low, they are substantially higher than those of copper, gold, and silver; moreover, molybdenum and tungsten must be plated with gold prior to soldering.

Therefore, the principal objective of the present invention was to develop a new ceramic substrate for multilayer packages exhibiting properties superior to those of $Al_2O_3$ for that application; viz., a lower dielectric constant ($<5$), a sintering temperature below 1000° C., a smooth flat surface without additional grinding and polishing, and enhanced dimensional control for the location of vias and pads.

SUMMARY OF THE INVENTION

The present invention is based upon the finding that the above objective can be achieved where a glass-ceramic containing $BPO_4$ as the predominant crystal phase comprises the substrate.

U.S. Pat. No. 4,576,920 discloses the production of glass-ceramic articles wherein $BPO_4$ constitutes the primary crystal phase. As described in that patent, the articles are prepared by heat treating precursor glass articles consisting essentially, expressed in terms of weight percent on the oxide basis, of about 5-35% $B_2O_3$, 10-50% $SiO_2$, and 25-75% $P_2O_5$, wherein $B_2O_3+SiO_2+P_2O_5>90\%$. As is explained in the description of those glass-ceramics, because of the very high levels of crystallinity present in the articles, when compared to the mole percentage of $BPO_4$ theoretically possible in the compositions, it was posited that at least some of the crystallization consisted of a $BPO_4$ solid solution with $SiO_2$. In like manner to the usage in that patent, the term $BPO_4$ as utilized herein includes solid solutions of $BPO_4$ with $SiO_2$.

Two properties of those glass-ceramics strongly recommend their utility as substrates for integrated circuit packaging; viz., their relatively low coefficients of thermal expansion (about $45-65 \times 10^{-7}$/°C. over the temperature range of 0°-300° C.) and their excellent dielectric properties. Of special interest to the field of electronic packaging is their very low dielectric constant at ambient temperature (about 4).

Initial experiments conducted to determine the possibility of producing multilayer integrated circuit packages through tape casting and firing frits having compositions within the ranges of U.S. Pat. No. 4,576,920 revealed that $BPO_4$ nucleated so efficiently that flow and densification of the glass powder prior to crystallization were effectively prevented. That circumstance led to the addition of various materials in an effort to retard the crystallization of $BPO_4$ without deleteriously affecting the basic character of the glass-ceramic. For example, the adverse effect upon electrical properties which the presence of the alkali metal oxides such as $Li_2O$, $Na_2O$, and $K_2O$ imparts is well recognized in the glass and ceramic art.

Experimental additions of the alkaline earth metal oxides, MnO, and ZnO indicated that each very strongly delayed the in situ crystallization of $BPO_4$. In fact, all were too effective; even fractions of a percent additions essentially stopped all crystallization. The glassy material resulting from those additions generally exhibited poor water durability and demonstrated large deformation when heated to about 900°-1000° C.

Additions of $Al_2O_3$ led to the crystallization of an $AlPO_4$ solid solution phase manifesting a higher coefficient of thermal expansion than $BPO_4$. Furthermore, flow prior to crystallization was severely reduced such as to render sintering of the frit to a high density difficult. Therefore, additions of $Al_2O_3$ should not exceed 3%, preferably less than 2%, and, most preferably in like manner to $Li_2O$, $Na_2O$, $K_2O$, MnO, ZnO, and the alkaline earth metal oxides, should be essentially absent, i.e., less than 1%, if present at all. In general, the total $B_2O_3+P_2O_5+SiO_2$ will preferably exceed 95%.

Small additions of $SiO_2$ improved the sinterability of the frit somewhat, but not enough to permit complete densification of the body at temperatures below 1000° C.

Finally, it was discovered that, by raising the $SiO_2$ content above 50% by weight and carefully controlling the concentrations of $B_2O_3$ and $P_2O_5$, frits could be prepared which exhibit excellent sintering capabilities when fired at temperatures between about 875°-1000° C. The glasses crystallize in situ to produce glass-ceramics containing $BPO_4$ as the predominant crystal phase. The inventive products demonstrate linear coefficients of thermal expansion less than about $45 \times 10^{-7}$/°C. and, typically, greater than $30 \times 10^{-7}$/°C. over the range of 25°-300° C., and dielectric constants at room temperature less than 5, customarily between 3 and 4. Hence, the linear coefficients of thermal expansion closely match that of silicon, thereby insuring good bonding between the two materials. Moreover, the lower dielectric constant provides the potential of higher density circuitry without cross talk and noise between circuit elements. Finally, the high levels of $SiO_2$ yielded frits and final products demonstrating good water durabilities. Resistance to attack by moisture is especially critical when dealing with glasses in powdered form such as the frits used in tape casting. And, because the final product is a fine-grained glass-ceramic, no extra finishing is required to secure a smooth flat surface.

The inventive glass compositions consist essentially, expressed in terms of weight percent on the oxide basis, of about 10-25% $B_2O_3$ 20-40% $P_2O_5$, and >50-65% $SiO_2$. Glass-ceramic bodies can be prepared from frits having compositions coming within those ranges by following the four general steps:

(1) a batch for a glass of a desired composition is melted;

(2) that melt is cooled to a temperature below the transformation range thereof and simultaneously a glass body of a desired configuration is shaped therefrom;

(3) that glass body is comminuted to a frit; and (4) that frit is sintered and crystallized in situ at a temperature between about 875°-1000° C. to form an integral, fine-grained, essentially non-porous glass-ceramic body.

As employed herein, the transformation range is defined as that temperature at which a molten melt is converted into a amorphous solid; that temperature commonly being considered as residing in the vicinity of the annealing point of the glass.

Because a frit is desired, the melt is frequently simply poured as a fine stream into a batch of cold water and the resulting particles of glass further comminuted to the required particle size. That practice has been termed "drigaging."

The preferred compositions consist essentially, expressed in terms of weight percent on the oxide basis, of about 15-25% $B_2O_3$, 25-35% $P_2O_5$, and 52-60% $SiO_2$, the total $B_2O_3+P_2O_5+SiO_2>95\%$.

DESCRIPTION OF PREFERRED EMBODIMENTS

Table I reports a number of glass compositions, expressed in terms of parts by weight on the oxide basis, illustrating the inventive products. Inasmuch as the sum of the individual constituents totals or closely approximates 100, for all practical purposes the value listed for each component can be deemed to reflect weight percent. The actual batch ingredients may comprise any materials, either oxides or other compounds, which, when melted together, will be transformed into the desired oxide in the proper proportions. For example, boric acid may provide the source of $B_2O_3$.

Batches were compounded, ballmilled to assist in securing a homogeneous melt, and charged into silica crucibles. The crucibles were covered, introduced into a furnace operating at about 1600° C., and the batches melted for about 2-4 hours. Some melts were cast into glass slabs, and those slabs were rolled into glass sheets of 6" width ($\approx$150 mm) and 0.25" thickness ($\approx$6.25 mm) which were immediately transferred to an annealer operating at about 600° C. Other melts were poured as a relatively thin stream into a water bath to quench the molten glass into small particles (drigaged).

Whereas the above description represents laboratory activity, it will be appreciated that the compositions can be melted and formed utilizing commercial, large scale glassmaking equipment and technology.

TABLE I

| | 1 | 2 | 3 | 4 | 5 | 6 | 7 | 8 |
|---|---|---|---|---|---|---|---|---|
| $SiO_2$ | 49.8 | 53.1 | 54.1 | 56.7 | 54.9 | 57.3 | 59.4 | 56.1 |
| $P_2O_5$ | 33.7 | 31.4 | 28.5 | 26.8 | 26.0 | 24.6 | 23.4 | 22.1 |
| $B_2O_3$ | 16.5 | 15.4 | 17.4 | 16.4 | 19.1 | 18.1 | 17.2 | 21.7 |

The glass sheet and/or the drigaged glass particles were crushed and milled to produce frit having a median particle size of about 3-10 microns. The frit was mixed with an organic binder/vehicle in a ball mill for 24 hours using a solids:organic binder/vehicle weight ratio of 1:1. The organic binder/vehicle comprised a binder (polyvinylbutyral), a solvent (toluene), and a surfactant (phosphate ester). The resultant slip was continuously applied onto a silicone-coated polyester carrier film having a thickness of 0.002" ($\approx$0.051 mm) utilizing a 0.025" ($\approx$0.625 mm) doctor blade. The coated film was dried in air at room temperature ($\approx$25° C.) to evaporate off the organic solvents, leaving a green tape about 0.007"-0.009" thick ($\approx$0.18 mm-0.24 mm). Green tape signifies the particles thereon were dried but not fired to sintering.

The layer of particles was stripped off the carrier film, cut into squares of about 3"$\times$3" ($\approx$75 mm$\times$75 mm), and six of the squares stacked up. In stacking the squares, each successive sheet was rotated 90° counterclockwise to reduce any thickness variation of an individual sheet (edge-to-edge) from becoming cumulative through the stack. The stack was transferred to a drying over operating at 75° C. and held therein for about 15 minutes to preheat the stack. The stack was moved into a hot press having platens heated to 75° C. and pressed for 15 seconds at 2500 psi. The stack was withdrawn from the press, turned over, rotated 90°, and repressed for another 15 seconds at 2500 psi and 75° C. The repressing reduces any nonuniformity of the load applied. The resultant laminate was approximately 0.050" ($\approx 1.25$ mm) in thickness.

Table II records the temperatures (Temp.) at which the laminates were sintered to achieve essentially complete density and to effect crystallinity in situ of $BPO_4$. In each instance the temperature was raised at a rate of about 300° C./hour and held at that temperature for one hour. The crystallized squares were cut into samples for testing such properties as linear coefficient of thermal expansion over the temperature range of 25°–300° C. (Exp.), reported in terms of $\times 10^{-7}/°C.$, dielectric constant at room temperature ($\approx 25°$ C.) and 100 KHz (D.C.), and dissipation factor at room temperature and 100 KHz (D.F.).

TABLE II

|  | 1 | 2 | 3 | 4 |
|---|---|---|---|---|
| Temp. | 1000° C. | 1000° C. | 1000° C. | 1000° C. |
| Exp. | 45.3 | 44.0 | 42.8 | 41.1 |
| D.C. | 3.92 | 3.81 | 3.70 | 3.83 |
| D.F. | <0.0005 | <0.0005 | <0.0005 | <0.0005 |
|  | 5 | 6 | 7 | 8 |
| Temp. | 1000° C. | 1000° C. | 1000° C. | 1000° C. |
| Exp. | 41.8 | 40.6 | 39.6 | 40.7 |
| D.C. | — | 3.53 | 3.71 | 3.53 |
| D.F. | — | <0.0005 | <0.0005 | <0.0005 |

The criticality of composition control is clearly evidenced through an observation of the properties exhibited by Example 1. Thus, the low lever of $SiO_2$ led to a body demonstrating a linear coefficient of thermal expansion higher than desired.

Example 7 is considered to be the most preferred composition.

We claim:

1. A thermally crystallizable glass which, in the form of frit, is capable of being sintered and crystallized in situ at temperatures below 1000° C. into an integral glass-ceramic body containing $BPO_4$ as the predominant crystal phase and exhibiting a linear coefficient of thermal expansion greater than $30 \times 10^{-7}/°C.$, but less than $45 \times 10^{-7}/°C.$, and a dielectric constant less than 5, said glass consisting essentially, expressed in terms of weight percent on the oxide basis, of about 10–25% $B_2O_3$, 20–40% $P_2O_5$, and >50–65% $SiO_2$, the total $B_2O_3 + P_2O_5 + SiO_2 > 95\%$, wherein $Li_2O$, $Na_2O$, $K_2O$, MnO, ZnO, and the alkaline earth metal oxides are essentially absent, and if present, $Al_2O_3$ in no more than 3%.

2. A thermally crystallizable glass according to claim 1 consisting essentially of 15–25% $B_2O_3$, 25–35% $P_2O_5$, and 52–60% $SiO_2$, wherein $B_2O_3 + P_2O_5 + SiO_2 > 95\%$.

3. A glass-ceramic body exhibiting a linear coefficient of thermal expansion greater than $30 \times 10^{-7}/°C.$, but less than $45 \times 10^{-7}/°C.$, a dielectric constant less than 5, and containing $BPO_4$ as the predominant crystal phase, said body having a composition consisting essentially, expressed in terms of weight percent on the oxide basis, of about 10–25% $B_2O_3$, 20–40% $P_2O_5$, and >50–65% $SiO_2$, the total $B_2O_3 + P_2O_5 + SiO_2 > 95\%$, wherein $Li_2O$, $Na_2O$, $K_2O$, MnO, ZnO, and the alkaline earth metal oxides are essentially absent, and if present, $Al_2O_3$ in no more than 3%.

4. A glass-ceramic body according to claim 3 consisting essentially of 15–25% $B_2O_3$, 25–35% $P_2O_5$, and 52–60% $SiO_2$, wherein $B_2O_3 + P_2O_5 + SiO_2 > 95\%$.

5. A substrate for electronic packaging consisting of a glass-ceramic material exhibiting a linear coefficient of thermal expansion greater than $30 \times 10^{-7}/°C.$, but less than $45 \times 10^{-7}/°C.$, a dielectric constant less than 5, and containing $BPO_4$ as the predominant crystal phase, said glass-ceramic material having a composition consisting essentially, expressed in terms of weight percent on the oxide basis, of about 10–25% $B_2O_3$, 20–40% $P_2O_5$, and >50–65% $SiO_2$, the total $B_2O_3 + P_2O_5 + SiO_2 \times 95\%$, wherein $Li_2O$, $Na_2O$, $K_2O$, MnO, ZnO, and the alkaline earth metal oxides are essentially absent, and if present, $Al_2O_3$ in no more than 3%.

6. A substrate according to claim 5 consisting essentially of 15–25% $B_2O_3$, 25–35% $P_2O_5$, and 52–60% $SiO_2$, wherein $B_2O_3 + P_2O_5 + SiO_2 > 95\%$.

* * * * *